(12) United States Patent
Hsieh (10) Patent No.: US 11,251,815 B2
(45) Date of Patent: Feb. 15, 2022

(54) DECODING CIRCUIT AND DECODING METHOD BASED ON VITERBI ALGORITHM

(71) Applicant: REALTEK SEMICONDUCTOR CORPORATION, Hsinchu (TW)

(72) Inventor: Chih-Nung Hsieh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/239,734

(22) Filed: Apr. 26, 2021

(65) Prior Publication Data
US 2021/0391875 A1    Dec. 16, 2021

(30) Foreign Application Priority Data
Jun. 16, 2020   (TW) .................................. 109120275

(51) Int. Cl.
*H03M 13/39* (2006.01)
*H03M 13/41* (2006.01)
*H03M 13/27* (2006.01)

(52) U.S. Cl.
CPC ... *H03M 13/3961* (2013.01); *H03M 13/2792* (2013.01); *H03M 13/4161* (2013.01)

(58) Field of Classification Search
CPC .............................................. H03M 13/3961
See application file for complete search history.

(56) References Cited

U.S. PATENT DOCUMENTS

| | | | | |
|---|---|---|---|---|
| 8,201,066 B1* | 6/2012 | Wang | ............... | G11B 20/10268 |
| | | | | 714/796 |
| 2001/0050889 A1* | 12/2001 | Hattori | ............... | G11B 20/1866 |
| | | | | 369/59.24 |
| 2001/0052098 A1* | 12/2001 | Miyauchi | ............. | H03M 13/39 |
| | | | | 714/746 |
| 2021/0058098 A1* | 2/2021 | Chang | ............... | H03M 13/4146 |

* cited by examiner

*Primary Examiner* — Joseph D Torres
(74) *Attorney, Agent, or Firm* — WPAT, PC (57) ABSTRACT

A decoding circuit and a decoding method based on the Viterbi algorithm are provided. The decoding method includes the following steps: decoding an encoded data based on the Viterbi algorithm to generate a decoded data; performing error correction on the decoded data to obtain a data content of the encoded data; comparing the decoded data and the data content to generate bit correction information; using the encoded data to calculate multiple first branch metrics based on the Viterbi algorithm, the first branch metrics corresponding to a target bit of the data content; adjusting at least one of the first branch metrics based on the data content and the bit correction information to generate multiple second branch metrics; and selecting the first branch metrics or the second branch metrics based on the bit correction information.

20 Claims, 8 Drawing Sheets

DECODING CIRCUIT AND DECODING METHOD BASED ON VITERBI ALGORITHM

BACKGROUND OF THE INVENTION

1. Field of the Invention

This disclosure generally relates to a decoding circuit and a decoding method, and, more particularly, to the Viterbi algorithm-based decoding circuit and decoding method.

2. Description of Related Art

To reduce the negative impact of the transmission channels on the data content to be transmitted, a communication system usually utilizes some coding techniques to encode the data content. The receiving end of the communication system has to decode the received data to restore the data content. The Viterbi decoder is a common error correction decoder that can work based on the hard-decision algorithm or soft-decision algorithm to perform decoding operations. The soft-decision algorithm gives the Viterbi decoder an improved decoding capability at the expense of significant increase in the circuit complexity and computational complexity, which may result in reduced performance, increased design difficulty, and higher costs in the electronic device at the receiving end.

SUMMARY OF THE INVENTION

In view of the issues of the prior art, an object of this disclosure is to provide a decoding circuit and a decoding method to reduce the circuit complexity and computational complexity of the electronic device at the receiving end.

A Viterbi algorithm-based decoding circuit is provided. The decoding circuit includes a Viterbi decoder, an error correction decoder, a bit check circuit, a branch metric calculation circuit, a branch metric adjustment circuit, and a multiplexer. The Viterbi decoder is configured to receive an encoded data and decode the encoded data based on the Viterbi algorithm to generate a decoded data. The error correction decoder is coupled to the Viterbi decoder and configured to perform error correction on the decoded data to obtain a data content of the encoded data. The bit check circuit is coupled to the Viterbi decoder and the error correction decoder and configured to compare the decoded data and the data content to generate bit correction information. The branch metric calculation circuit is configured to calculate multiple first branch metrics using the encoded data based on the Viterbi algorithm, and the first branch metrics correspond to a target bit of the data content. The branch metric adjustment circuit is coupled to the branch metric calculation circuit and configured to adjust at least one of the first branch metrics according to the data content and the bit correction information to generate multiple second branch metrics. The multiplexer is coupled to the branch metric calculation circuit and the branch metric adjustment circuit and configured to select the first branch metrics or the second branch metrics according to the bit correction information.

A Viterbi algorithm-based decoding method is also provided. The decoding method includes the following steps: decoding an encoded data based on the Viterbi algorithm to generate a decoded data; performing error correction on the decoded data to obtain a data content of the encoded data; comparing the decoded data with the data content to generate bit correction information; calculating multiple first branch metrics using the encoded data based on the Viterbi algorithm, the first branch metrics corresponding to a target bit of the data content; adjusting at least one of the first branch metrics according to the data content and the bit correction information to generate multiple second branch metrics; and selecting the first branch metrics or the second branch metrics according to the bit correction information.

The decoding circuit and decoding method provided in this disclosure improve the decoding performance (such as decoding accuracy) by adjusting the branch metric(s) in the Viterbi algorithm according to the output of the error correction decoder. In comparison with the traditional technology, the error correction decoder provided in this disclosure can use the hard-decision algorithm to reduce the computational complexity, while the decoding circuit and decoding method can maintain high decoding performance.

These and other objectives of this disclosure no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a Viterbi algorithm-based decoding circuit and a Viterbi algorithm-based decoding method. On account of that some or all elements of the decoding circuit could be known, the detail of such elements is omitted provided that such detail has little to do with the features of this disclosure, and that this omission nowhere dissatisfies the specification and enablement requirements. Some or all of the processes of the decoding method may be implemented by software and/or firmware, and can be performed by the decoding circuit or its equivalent. A person having ordinary skill in the art can choose components or steps equivalent to those described in this specification to carry out this disclosure, which means that the scope of this disclosure is not limited to the embodiments in the specification.

Figure 1:
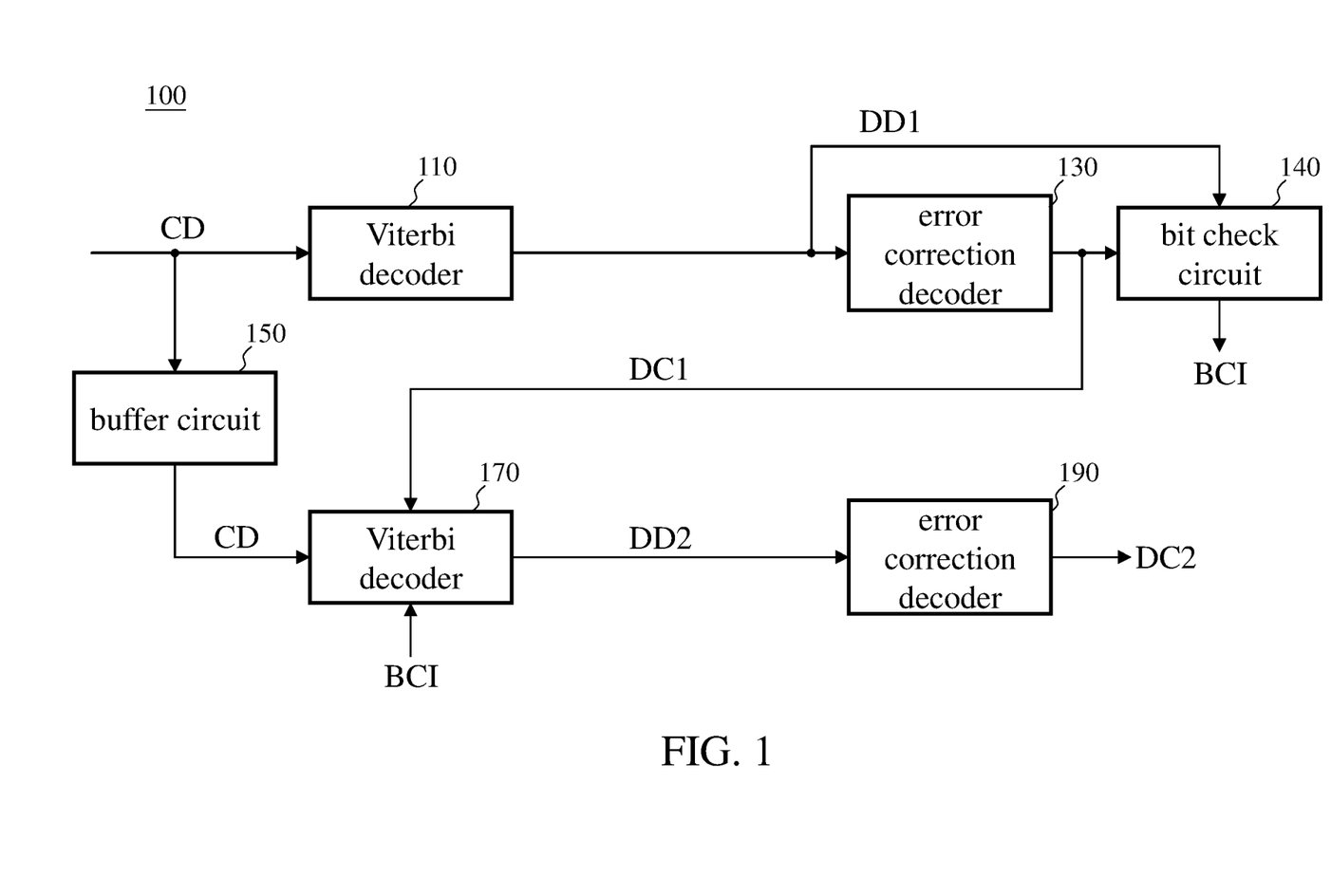
FIG. 1 is a functional block diagram of a Viterbi algorithm-based decoding circuit according to an embodiment of this disclosure.
Figure 2:
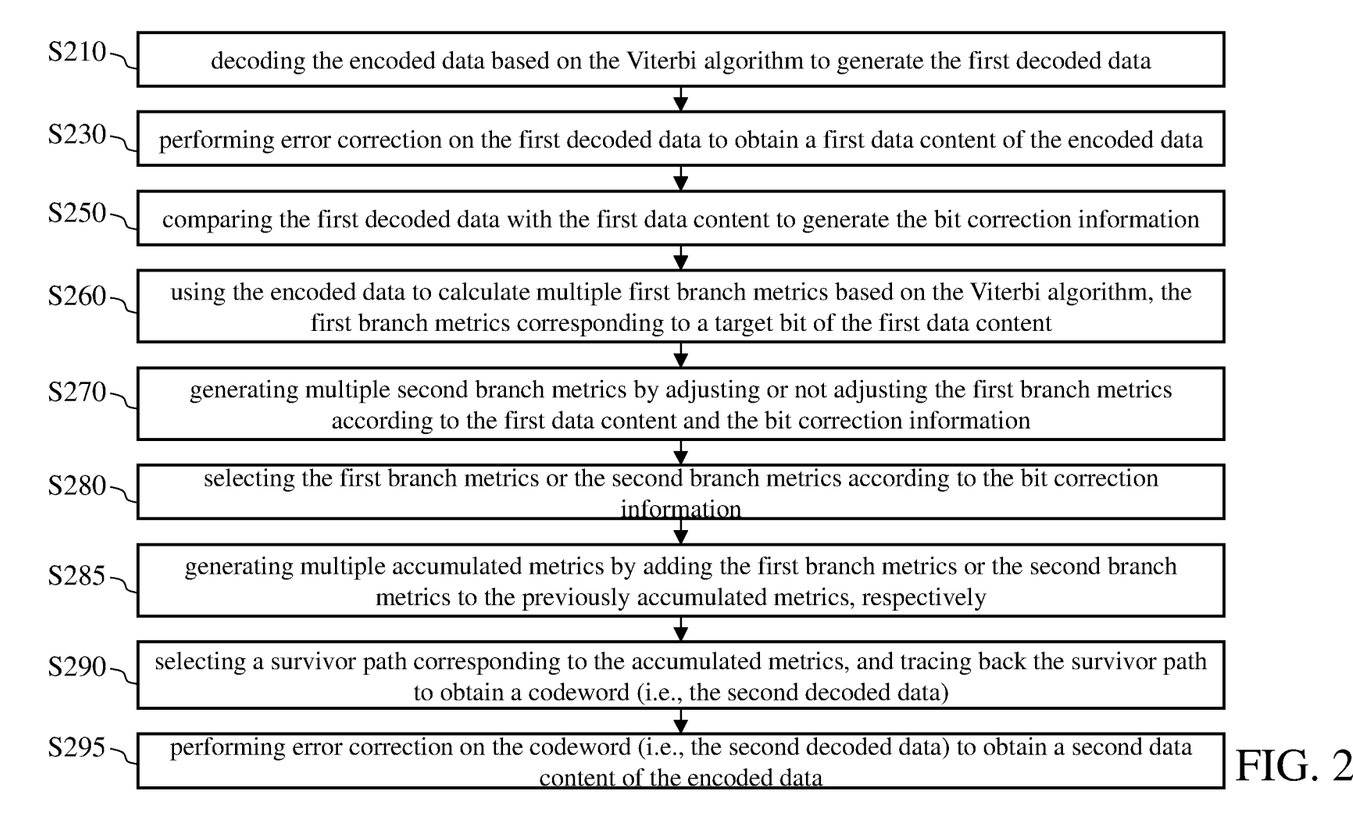
FIG. 2 is a flowchart of a decoding method according to an embodiment of this disclosure.

FIG. 1 is a functional block diagram of a Viterbi algorithm-based decoding circuit according to an embodiment of this disclosure, and FIG. 2 shows a flowchart of the corresponding decoding method. The decoding circuit 100 is implemented at the receiving end of a communication system and includes a Viterbi decoder 110, an error correction decoder 130, a bit check circuit 140, a buffer circuit 150, a Viterbi decoder 170, and an error correction decoder 190. The encoded data CD is the outcome of the encoding of a data content (e.g., video data, audio data, text data, etc.) by the transmitting end of the communication system.

After receiving the encoded data CD, the decoding circuit 100 inputs the encoded data CD to the Viterbi decoder 110 and stores the encoded data CD in the buffer circuit 150. The Viterbi decoder 110 decodes the encoded data CD based on the Viterbi algorithm and generates the first decoded data DD1 (step S210). The Viterbi decoder 110 is a conventional circuit, and since its operating principle is well known to people having ordinary skill in the art, its details are thus omitted for brevity. The first decoded data DD1 includes a data block and a correction block.

The error correction decoder 130, coupled to the Viterbi decoder 110, corrects the erroneous bit(s) in the data block by using the correction block to perform error correction on the data block, and a first data content DC1 is generated accordingly (step S230). The first data content DC1 is the outcome of the error correction of the data block of the first decoded data DD1. If the content of the data block of the first decoded data DD1 is correct, the first data content DC1 is identical to the data block of the first decoded data DD1; if not, there are N different bit(s) between the data block of the first decoded data DD1 and the first data content DC1 (N, an integer greater than or equal to one, is the number of bit(s) corrected in step S230). In some embodiments, the error correction decoder 130 is a Bose-Chaudhuri-Hocquenghem (BCH) code-based error correction decoder, including, but not limited to, Reed-Solomon (RS) code error correction decoder.

The bit check circuit 140, coupled to the Viterbi decoder 110 and the error correction decoder 130, checks whether the data block of the first decoded data DD1 has been corrected (for example, by comparing the first decoded data DD1 with the first data content DC1), and the bit correction information BCI is generated accordingly (step S250). The length of the bit correction information BCI is the same as the length of the first data content DC1 and the length of the data block of the first decoded data DD1. Of the bit correction information BCI, bit 0 (or 1) indicates that the corresponding bit in the first data content DC1 (e.g., the bit at the same position) has not been corrected, and bit 1 (or 0) indicates that the corresponding bit in the first data content DC1 has been corrected. In some embodiments, the bit check circuit 140 uses an exclusive-OR gate to perform bitwise operations on the first decoded data DD1 and the first data content DC1 to generate the bit correction information BCI.

The Viterbi decoder 170 reads the encoded data CD from the buffer circuit 150, and uses the first data content DC1 and the bit correction information BCI to decode the encoded data CD to generate a codeword which is the second decoded data DD2. Similarly, the second decoded data DD2 includes a data block and a correction block. The Viterbi decoder 170 and the Viterbi decoder 110 decode the same encoded data CD at different time points. In other words, there is a delay between the Viterbi decoder 110 and the Viterbi decoder 170. This delay can be set by the circuit designer. In some embodiments, the delay is shorter when the first data content DC1 and the bit correction information BCI are generated earlier. The detailed circuit of the Viterbi decoder 170 will be discussed in connection with FIG. 4.

The error correction decoder 190 corrects the erroneous bit(s) in the data block of the second decoded data DD2 by using the correction block of the second decoded data DD2 to perform error correction on the data block. The second data content DC2 is the outcome of the error correction of the data block of the second decoded data DD2 (step S295). If the content of the data block of the second decoded data DD2 is correct, the second data content DC2 is identical to the data block of the second decoded data DD2; if not, there is at least one different bit between the data block of the second decoded data DD2 and the second data content DC2.

In some embodiments, the error correction decoder 130 and the error correction decoder 190 may share circuits, that is, the error correction decoder 130 and the error correction decoder 190 are the same decoder.

Figure 3:
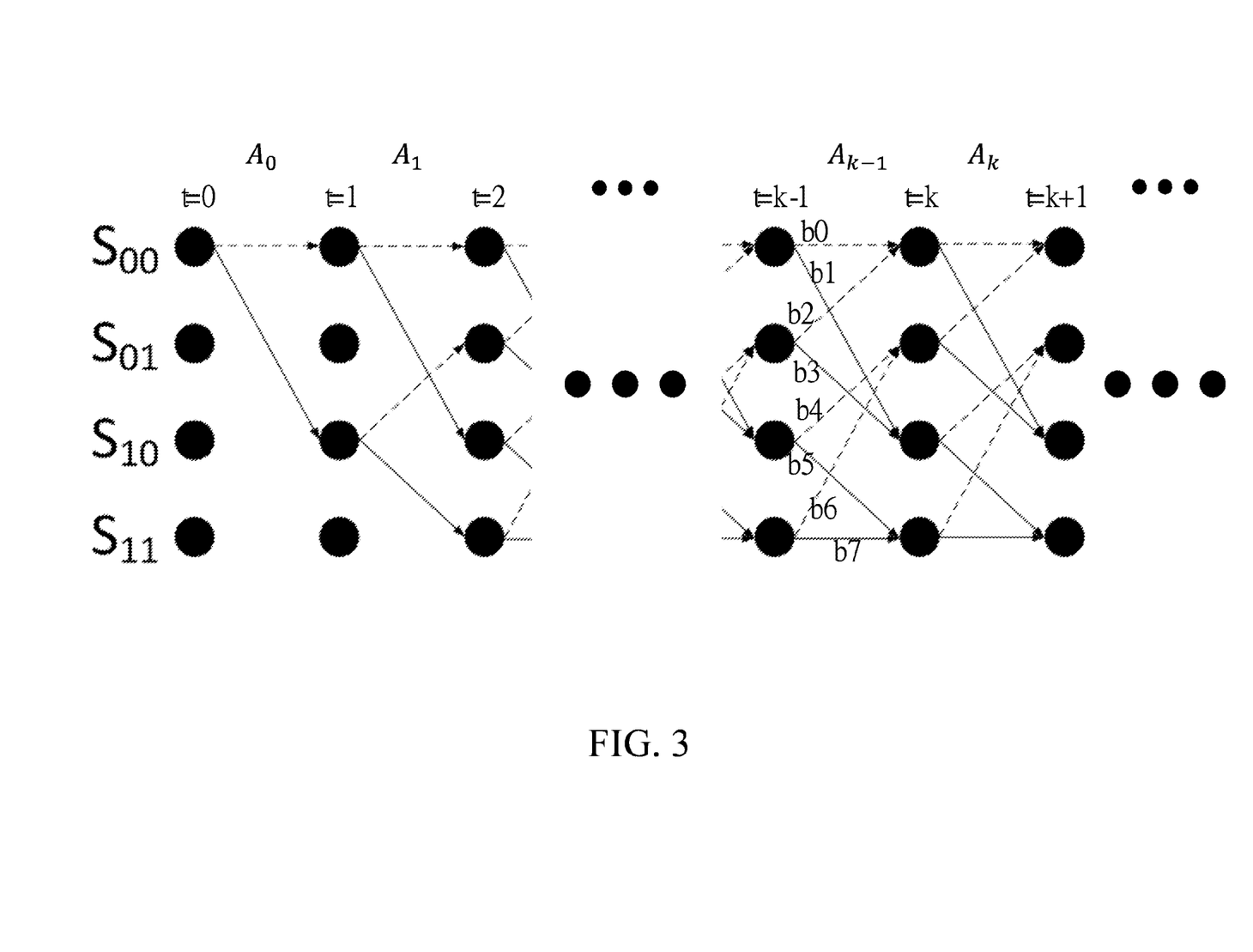
FIG. 3 is a schematic diagram of the Viterbi algorithm.

FIG. 3 is a schematic diagram of the Viterbi algorithm. The example in FIG. 3 corresponds to (2,1,2) convolutional code, with S00, S01, S10, S11 representing four states, and t=0, 1, 2, . . . , k−1, k, k+1, . . . representing multiple stages (k being a positive integer, t=0 being the initial stage). After stage 2 (t=2), each state has two output branches, one of which corresponds to bit 0 (indicated by the dashed line), and the other of which corresponds to bit 1 (indicated by the solid line). For example, there are a total of 8 branches between stage k−1 and stage k, wherein branches b0, b2, b4, and b6 correspond to bit 0, while branches b1, b3, b5, and b7 correspond to bit 1. The following discussions are made about the detailed circuit and operation of the Viterbi decoder 170, in connection with FIG. 4 and FIG. 2.

Figure 4:
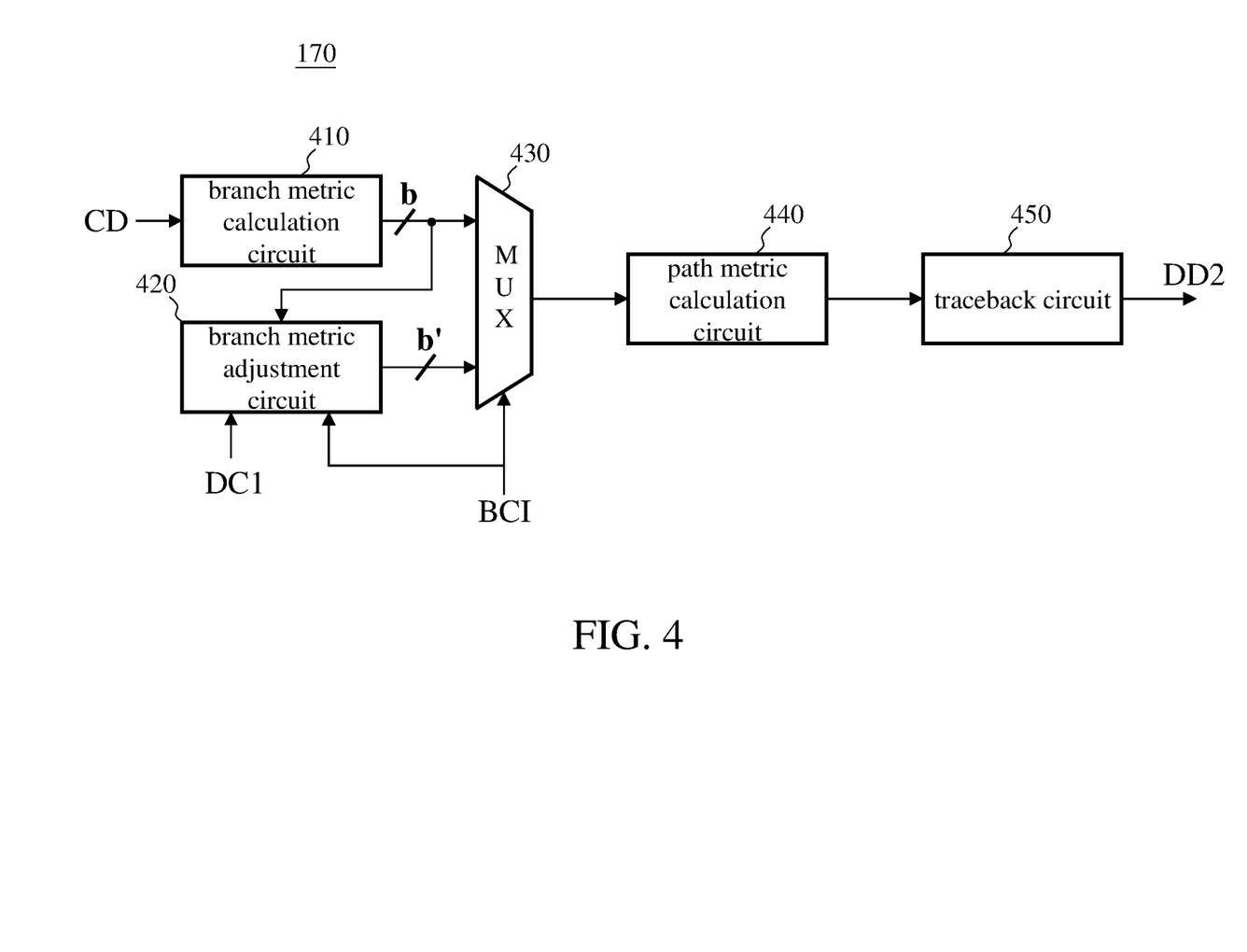
FIG. 4 is a functional block diagram of the Viterbi decoder 170 in FIG. 1.

FIG. 4 is a functional block diagram of the Viterbi decoder 170 in FIG. 1. The Viterbi decoder 170 includes a branch metric calculation circuit 410, a branch metric adjustment circuit 420, a multiplexer (MUX) 430, a path metric calculation circuit 440, and a traceback circuit 450.

The branch metric calculation circuit 410 uses the encoded data CD to calculate the first branch metrics b of multiple branches based on the Viterbi algorithm (step S260). The operation of the branch metric calculation circuit 410 is well-known to people having ordinary skill in the art, and the details are thus omitted for brevity. The first branch metrics b represent a set of branch metrics of all output branches of a certain stage, and the first branch metrics b correspond to one bit of the first data content DC1 (hereinafter referred to as the target bit). More specifically, the first data content DC1 contains a plurality of bits $A_0$, $A_1$, $A_2$, . . . , $A_{k-1}$, $A_k$, $A_{k+1}$, . . . , and the branches b0 to b7 correspond to the target bit $A_{k-1}$. In other words, the content of the first branch metrics b depends intimately on the value of the target bit $A_{k-1}$. If the target bit $A_{k-1}$ is 0, the branches b0, b2, b4, and b6 are more likely to be selected (i.e., they are more reliable and thus more likely to be a part of the survivor path of the Viterbi algorithm. If, on the contrary, the target bit $A_{k-1}$ is 1, the branches b1, b3, b5, and b7 are more likely to be selected.

The branch metric adjustment circuit 420 generates multiple second branch metrics b' by adjusting or not adjusting the first branch metrics b according to the first data content DC1 and the bit correction information BCI (step S270). More specifically, the branch metric adjustment circuit 420 includes at least the following three operation scenarios: (1) The bit correction information BCI indicates that the target bit $A_{k-1}$ has not been corrected in step S230; (2) the bit correction information BCI indicates that the target bit $A_{k-1}$ has been corrected in step S230, and the corrected target bit $A_{k-1}$ is bit zero; and (3) the bit correction information BCI indicates that the target bit $A_{k-1}$ has been corrected in step S230, and the corrected target bit $A_{k-1}$ is bit one.

In scenario (1), because the target bit $A_{k-1}$ is a correct bit in the first place (which means that the first branch metrics b are of high reliability), the branch metric adjustment circuit 420 does not adjust the first branch metrics b, so the second branch metrics b' are identical to the first branch metrics b. Note that in some embodiments, the branch metric adjustment circuit 420 generates the second branch metrics b' by adding zero to the first branch metrics b; in other words, in some embodiments, though the second branch metrics b' are identical to the first branch metrics b, the second branch metrics b' can still be regarded as adjusted branch metrics.

In scenario (2), because the value of the target bit $A_{k-1}$ is one before the correction (which means that the branches b1, b3, b5, and b7 corresponding to one are of lower reliability), the branch metric adjustment circuit 420 increases (or decreases) the branch metrics of the branches b1, b3, b5, and b7, and/or decreases (or increases) the branch metrics of the branches b0, b2, b4, and b6. In other words, the branch metric adjustment circuit 420 adjusts one half of the first branch metrics b (e.g., by adding a positive or negative number), and adds zero to the other half before outputting (which other half is regarded as adjusted or unadjusted) or directly outputs the other half (which other half is regarded as unadjusted).

In scenario (3), because the value of the target bit $A_{k-1}$ is zero before the correction (which means that the branches b0, b2, b4, and b6 corresponding to zero are of lower reliability), the branch metric adjustment circuit 420 increases (or decreases) the branch metrics of the branches b0, b2, b4, and b6, and/or decreases (or increases) the branch metrics of the branches b1, b3, b5, and b7. In other words, the branch metric adjustment circuit 420 adjusts one half of the first branch metrics b (e.g., by adding a positive or negative number), and adds zero to the other half before outputting (which other half is regarded as adjusted or unadjusted) or directly outputs the other half (which other half is regarded as unadjusted).

By referring to the bit correction information BCI, the multiplexer 430 selects the first branch metrics b or the second branch metrics b' to output to the path metric calculation circuit 440 (step S280). More specifically, when the bit correction information BCI indicates that the target bit $A_{k-1}$ has not been corrected, the multiplexer 430 outputs the first branch metrics b; when, on the other hand, the bit correction information BCI indicates that the target bit $A_{k-1}$ has been corrected, the multiplexer 430 outputs the second branch metrics b'.

The path metric calculation circuit 440 generates multiple accumulated metrics by adding the first branch metrics b or the second branch metrics b' to the corresponding previously accumulated metrics, respectively. (Step S285). Finally, the traceback circuit 450 selects the path corresponding to the largest (embodiment one) or the smallest (embodiment two) of the accumulated metrics as the survivor path, and traces back the survivor path to obtain the codeword corresponding to the survivor path. The codeword is the second decoded data DD2 (step S290). The path metric calculation circuit 440 and the traceback circuit 450 are well-known to people having ordinary skill in the art, so the details are omitted for brevity.

In embodiment one, the branch metric adjustment circuit 420 decreases the branch metrics of the branches b1, b3, b5, and b7, and/or increases the branch metrics of the branches b0, b2, b4, and b6 in scenario (2) discussed above, and decreases the branch metrics of branches b0, b2, b4, and b6, and/or increases the branch metrics of branches b1, b3, b5, and b7 in scenario (3) discussed above. In embodiment two, the branch metric adjustment circuit 420 increases the branch metrics of the branches b1, b3, b5, and b7, and/or decreases the branch metrics of the branches b0, b2, b4, and b6 in scenario (2) discussed above, and increases the branch metrics of branches b0, b2, b4, and b6, and/or decreases the branch metrics of branches b1, b3, b5, and b7 in scenario (3) discussed above.

Figure 5:
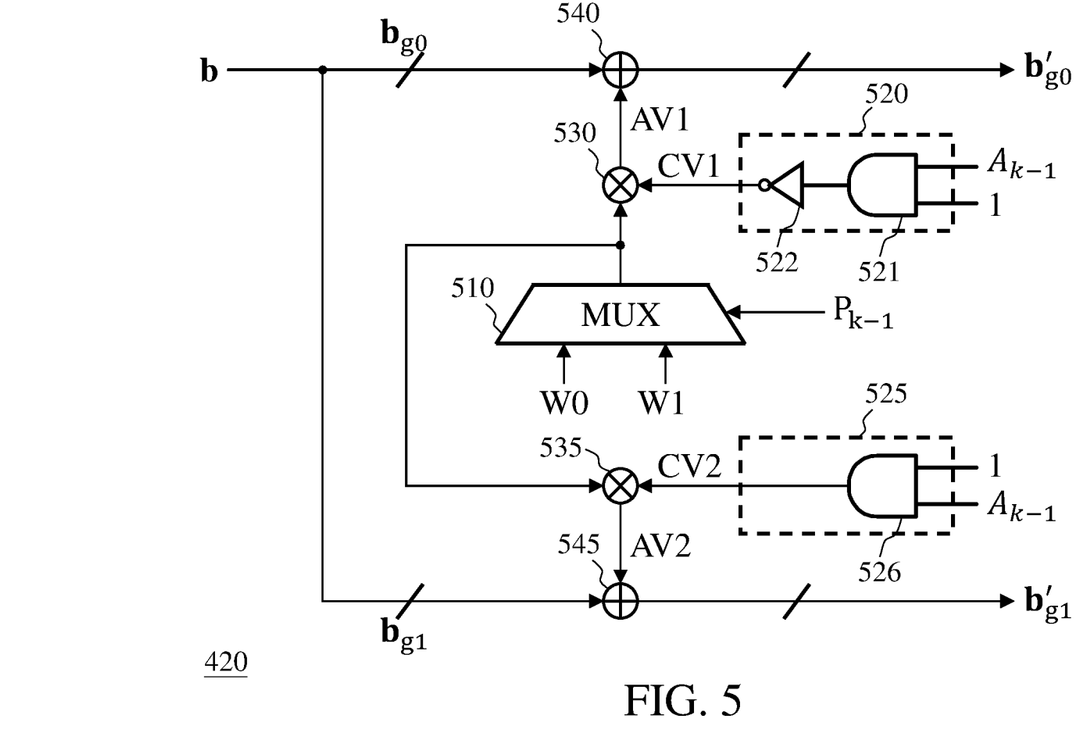
FIG. 5 is a circuit diagram of the branch metric adjustment circuit 420 according to this disclosure.
Figure 6:
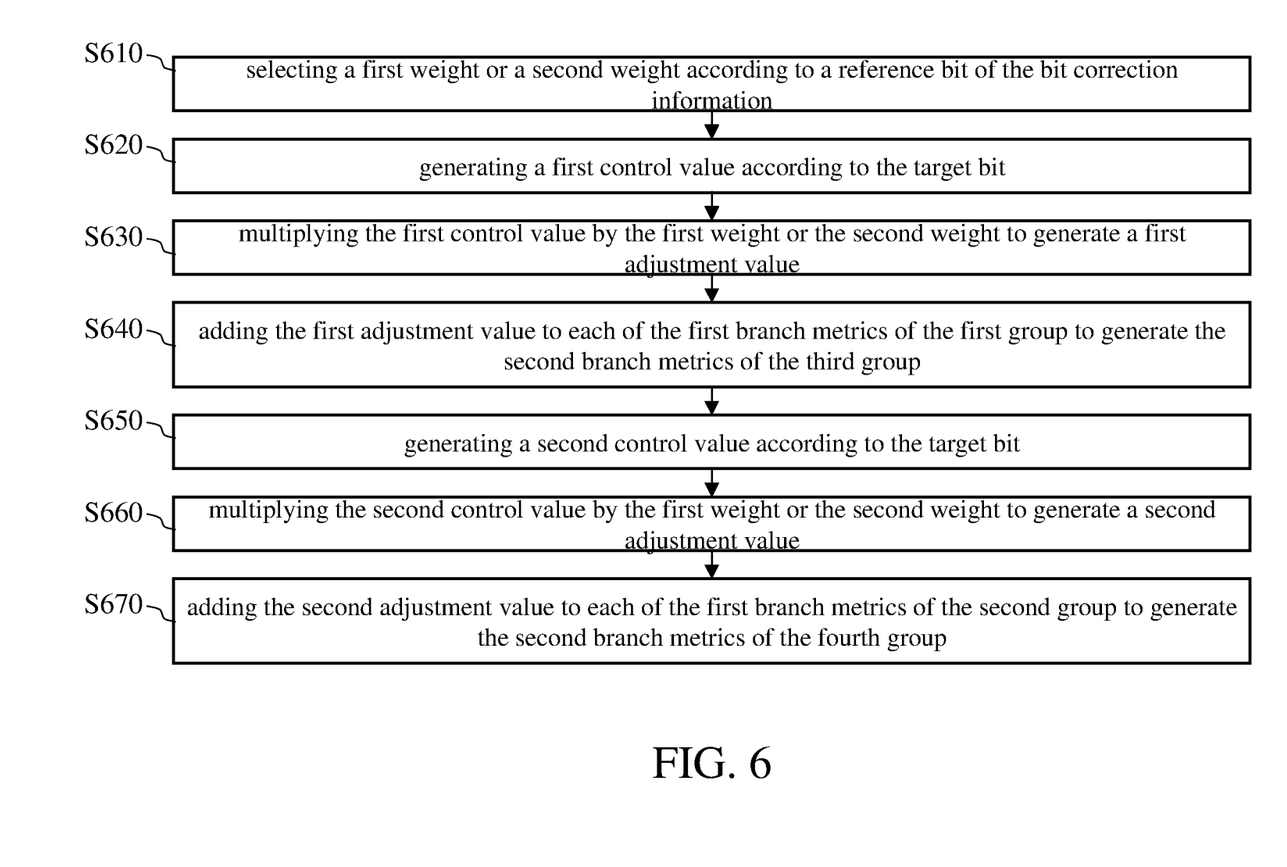
FIG. 6 is a flowchart of the operation of the branch metric adjustment circuit 420 according to this disclosure.

FIG. 5 is a circuit diagram of the branch metric adjustment circuit 420 according to this disclosure. The branch metric adjustment circuit 420 includes a multiplexer 510, a logic circuit 520, a logic circuit 525, a multiplier 530, a multiplier 535, an adder 540, and an adder 545. FIG. 6 is a flowchart of the operation of the branch metric adjustment circuit 420 (i.e., the detailed steps of step S270).

The first branch metrics b can be divided into the first group $b_{g0}$ (including the branch metrics of the branches b0, b2, b4, and b6 corresponding to bit zero) and the second group $b_{g1}$ (including the branch metrics of the branches b1, b3, b5, and b7 corresponding to bit one). Likewise, the second branch metrics b' can be divided into a third group $b_{g0}'$ (including the unadjusted or adjusted branch metrics of the branches b0, b2, b4, and b6 corresponding to bit zero) and the fourth group $b_{g1}'$ (including the unadjusted or adjusted branch metrics of the branches b1, b3, b5, and b7 corresponding to bit one). The details of the generation of the second branch metrics b' by the branch metric adjustment circuit 420 by adjusting or not adjusting the first branch metrics b according to the bit correction information BCI and the first data content DC1 are discussed below.

The multiplexer 510 selects the weight W0 or the weight W1 according to the reference bit $P_{k-1}$ of the bit correction information BCI. The reference bit $P_{k-1}$ indicates whether the target bit $A_{k-1}$ of the first data content DC1 has been corrected or not) (step S610).

The logic circuit 520 and the logic circuit 525 respectively generate the control value CV1 and the control value CV2 according to the target bit $A_{k-1}$ (steps S620 and S650). In the embodiment of FIG. 5, the logic circuit 520 includes an AND gate 521 and an inverter 522, and the logic circuit 525 includes an AND gate 526. The respective two inputs of the AND gate 521 and the AND gate 526 are the target bit $A_{k-1}$ and the logical value one. Therefore, the logical value of the control value CV1 is a logical inversion of the target bit $A_{k-1}$, and the logical value of the control value CV2 is the same as the target bit $A_{k-1}$. The detailed circuits of the logic circuit 520 and the logic circuit 525 shown in FIG. 5 are given for illustrative purposes only, and the present disclosure is not limited thereto.

The multiplier 530 and the multiplier 535 respectively multiply the weight W0 or the weight W1 by the control value CV1 and the control value CV2 to generate the adjustment value AV1 and the adjustment value AV2, respectively (steps S630 and S660). In other words, the adjustment value AV1 (AV2) is zero or equal to one of the weight W0 and the weight W1.

The adder 540 adds the adjustment value AV1 to the first group $b_{g0}$ to generate the third group $b_{g0}'$ (step S640, that is, bx'=bx+AV1, x={0, 2, 4, 6} for the example in FIG. 3), and the adder 545 adds the adjustment value AV2 to the second group $b_{g1}$ to generate the fourth group $b_{g1}'$ (step S670, that is, by'=by+AV2, y={1, 3, 5, 7} for the example in FIG. 3).

For example, if the reference bit $P_{k-1}$ being one means that the target bit $A_{k-1}$ has been corrected, and the multiplexer 510 outputs W0 and W1 when the reference bit $P_{k-1}$ is zero and one, respectively, then in embodiment one discussed above (i.e., the survivor path corresponds to the largest accumulated metric) W1>W0, and in embodiment two discussed above (i.e., the survivor path corresponds to the smallest accumulated metric) W1<W0. In some embodiments, one of the weight W0 and the weight W1 can be set to zero to simplify the circuit.

In summary, the Viterbi decoder 170 uses the first data content DC1 and the bit correction information BCI to improve the decoding performance. When the error correction decoder 130 is implemented using the hard-decision algorithm, the decoding circuit 100 has the advantages of low circuit complexity and high decoding performance. However, in addition to the hard-decision algorithm, the decoding circuit and decoding method provided in this disclosure may also adopt the soft-decision algorithm.

Figure 7:
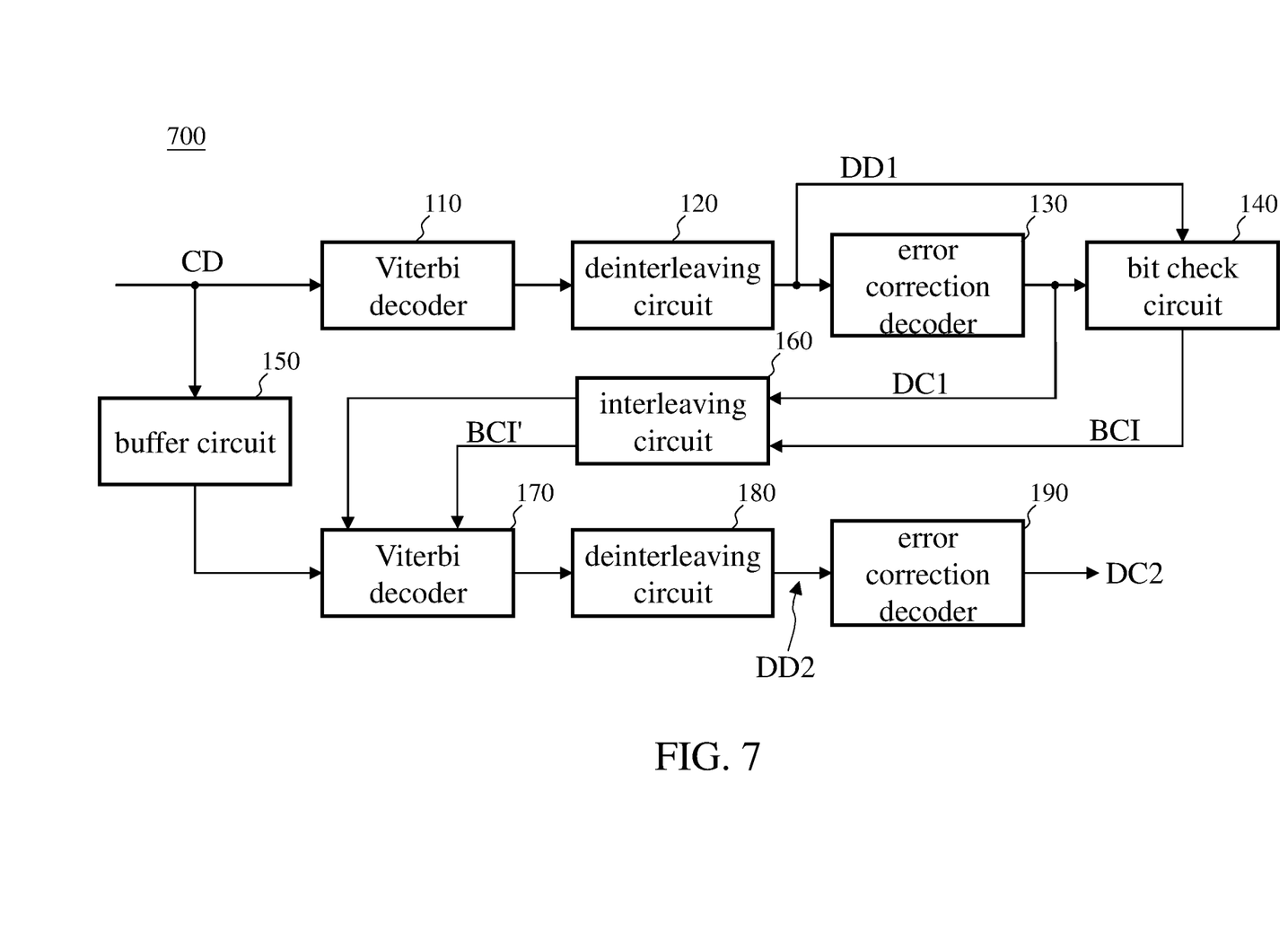
FIG. 7 is a functional block diagram of a Viterbi algorithm-based decoding circuit according to another embodiment of this disclosure.
Figure 8:
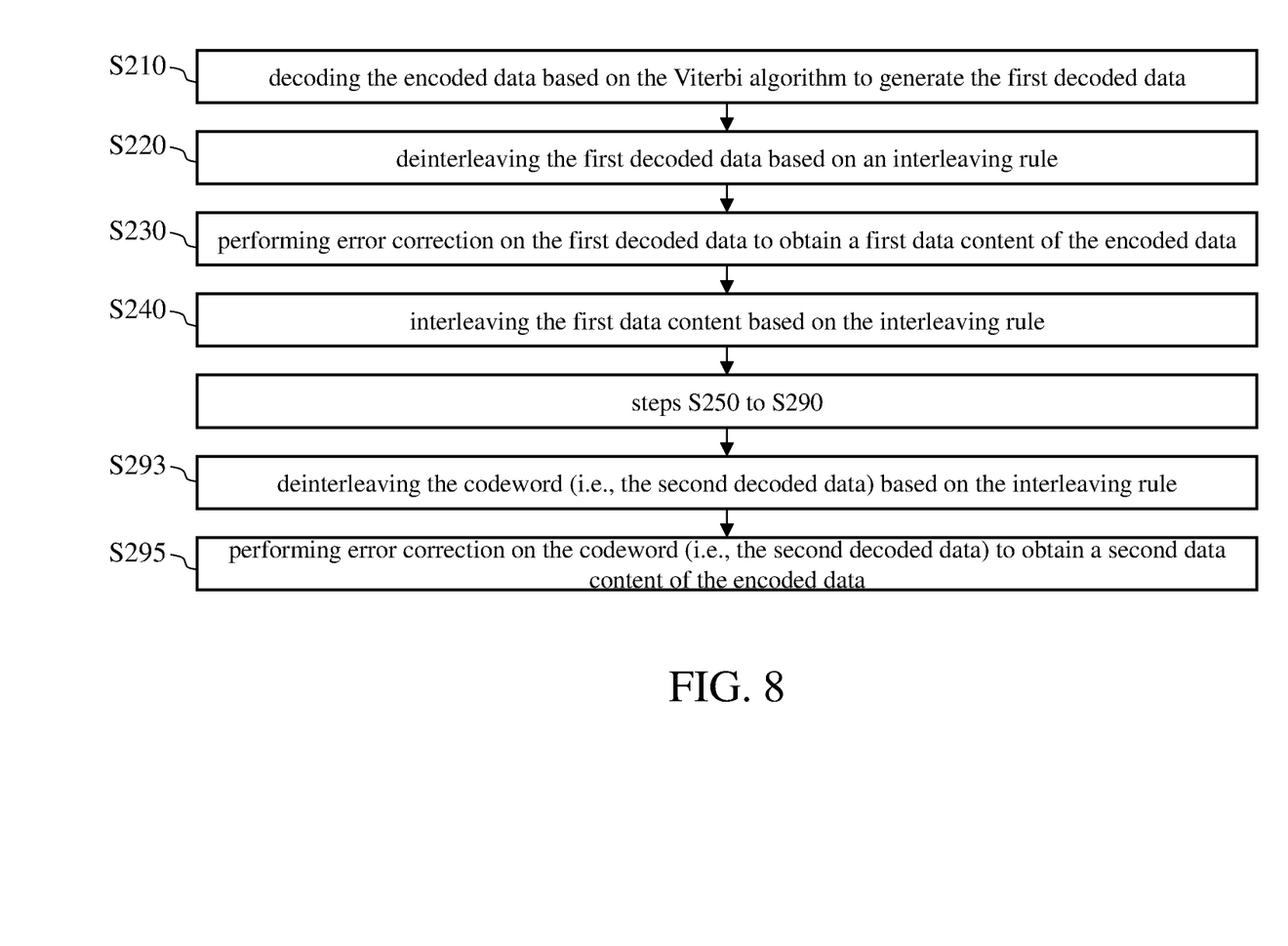
FIG. 8 is a flowchart of a decoding method according to an embodiment of this disclosure.

In some embodiments, in order to reduce the interference caused by the channel to the transmitted data, the transmitting end performs the interleaving operation on the data based on an interleaving rule, and the receiving end performs the deinterleaving operation on the data based on the same interleaving rule. FIG. 7 is a functional block diagram of a Viterbi algorithm-based decoding circuit according to another embodiment of this disclosure, and FIG. 8 shows a flowchart of the corresponding decoding method. The decoding circuit 700 is similar to the decoding circuit 100, except that the decoding circuit 700 further includes a deinterleaving circuit 120, an interleaving circuit 160, and a deinterleaving circuit 180. The bit correction information BCI outputted by the bit check circuit 140 is also processed by the interleaving circuit 160 to generate the bit correction information BCI' which is provided to the Viterbi decoder 170. The process in FIG. 8 is similar to the process in FIG. 2, except that FIG. 8 further includes steps S220, S240, and S293.

The deinterleaving circuit 120, coupled between the Viterbi decoder 110 and the error correction decoder 130, deinterleaves the first decoded data DD1 based on the interleaving rule (step S220). The interleaving circuit 160, coupled between the error correction decoder 130 and the Viterbi decoder 170 (i.e., between the error correction decoder 130 and the branch metric adjustment circuit 420), interleaves the first data content DC1 based on the interleaving rule (step S240). The deinterleaving circuit 180, coupled between the Viterbi decoder 170 and the error correction decoder 190, deinterleaves the second decoded data DD2 (i.e., the codeword outputted by the traceback circuit 450) based on the interleaving rule (step S293). The deinterleaving operation and the interleaving operation are well-known to people having ordinary skill in the art, so the details are omitted for brevity.

Since a person having ordinary skill in the art can appreciate the implementation detail and the modification thereto of the present method embodiment through the disclosure of the device embodiment, repeated and redundant description is thus omitted. Please note that there is no step sequence limitation for the method embodiments as long as the execution of each step is applicable. Furthermore, the shape, size, and ratio of any element and the step sequence of any flowchart in the disclosed figures are exemplary for understanding, not for limiting the scope of this disclosure.

The aforementioned descriptions represent merely the preferred embodiments of this disclosure, without any intention to limit the scope of this disclosure thereto. Various equivalent changes, alterations, or modifications based on the claims of this disclosure are all consequently viewed as being embraced by the scope of this disclosure.

What is claimed is:

1. A Viterbi algorithm-based decoding circuit, comprising:
    a Viterbi decoder configured to receive an encoded data and decode the encoded data based on the Viterbi algorithm to generate a decoded data;
    an error correction decoder coupled to the Viterbi decoder and configured to perform error correction on the decoded data to obtain a data content of the encoded data;
    a bit check circuit coupled to the Viterbi decoder and the error correction decoder and configured to compare the decoded data and the data content to generate bit correction information;
    a branch metric calculation circuit configured to calculate a plurality of first branch metrics using the encoded data based on the Viterbi algorithm, the first branch metrics corresponding to a target bit of the data content;
    a branch metric adjustment circuit coupled to the branch metric calculation circuit and configured to adjust at least one of the first branch metrics according to the data content and the bit correction information to generate a plurality of second branch metrics; and
    a multiplexer coupled to the branch metric calculation circuit and the branch metric adjustment circuit and configured to select the first branch metrics or the second branch metrics according to the bit correction information.

2. The decoding circuit of claim 1, wherein the encoded data has been subjected to an interleaving operation which is based on an interleaving rule, and the decoding circuit further comprises:
    a deinterleaving circuit coupled between the Viterbi decoder and the error correction decoder and configured to deinterleave the decoded data based on the interleaving rule; and
    an interleaving circuit coupled between the error correction decoder and the branch metric adjustment circuit and configured to interleave the data content based on the interleaving rule.

3. The decoding circuit of claim 1, wherein the multiplexer is a first multiplexer, the first branch metrics comprise a first group and a second group, and the second branch metrics comprise a third group and a fourth group, and the branch metric adjustment circuit comprises:
    a second multiplexer configured to select a first weight or a second weight according to a reference bit of the bit correction information;
    a first logic circuit configured to generate a first control value according to the target bit;
    a first multiplier coupled to the second multiplexer and configured to multiply the first control value by the first weight or the second weight to generate a first adjustment value;
    a first adder coupled to the first multiplier and configured to add the first adjustment value to each of the first branch metrics of the first group to generate the second branch metrics of the third group;
    a second logic circuit configured to generate a second control value according to the target bit;

a second multiplier coupled to the second multiplexer and configured to multiply the second control value by the first weight or the second weight to generate a second adjustment value; and a second adder coupled to the second multiplier and configured to add the second adjustment value to each of the first branch metrics of the second group to generate the second branch metrics of the fourth group.

4. The decoding circuit of claim 3, wherein the first control value and the target bit have opposite bit values, and the second control value and the target bit have a same bit value.

5. The decoding circuit of claim 4, wherein the first group and the third group correspond to the target bit being bit zero, and the second group and the fourth group correspond to the target bit being bit one.

6. The decoding circuit of claim 3, wherein the first adjustment value is one of the first weight and the second weight or zero, and the second adjustment value is one of the first weight and the second weight or zero.

7. The decoding circuit of claim 3, wherein the reference bit indicates whether the target bit has been corrected.

8. The decoding circuit of claim 7, wherein a length of the bit correction information is same as a length of the data content, and a position of the reference bit in the bit correction information is same as a position of the target bit in the data content.

9. The decoding circuit of claim 1, further comprising:
a path metric calculation circuit coupled to the multiplexer and configured to add the first branch metrics or the second branch metrics to a plurality of previously accumulated metrics, respectively, to generate a plurality of accumulated metrics; and
a traceback circuit coupled to the path metric calculation circuit and configured to select a survivor path according to the accumulated metrics and backtrack the survivor path to obtain a codeword corresponding to the survivor path.

10. The decoding circuit of claim 9, wherein the error correction decoder is a first error correction decoder, the data content is a first data content, and the decoding circuit further comprises:
a second error correction decoder coupled to the traceback circuit and configured to perform error correction on the codeword to obtain a second data content of the encoded data.

11. A Viterbi algorithm-based decoding method employed in a decoding circuit, comprising:
decoding, by the decoding circuit, an encoded data based on the Viterbi algorithm to generate a decoded data;
performing, by the decoding circuit, error correction on the decoded data to obtain a data content of the encoded data;
comparing, by the decoding circuit, the decoded data with the data content to generate bit correction information;
calculating, by the decoding circuit, a plurality of first branch metrics using the encoded data based on the Viterbi algorithm, the first branch metrics corresponding to a target bit of the data content;
adjusting, by the decoding circuit, at least one of the first branch metrics according to the data content and the bit correction information to generate a plurality of second branch metrics; and
selecting, by the decoding circuit, the first branch metrics or the second branch metrics according to the bit correction information.

12. The decoding method of claim 11, wherein the encoded data has been subjected to an interleaving operation which is based on an interleaving rule, and the decoding method further comprises:
deinterleaving the decoded data based on the interleaving rule after the decoded data is generated and before error correction is performed on the decoded data; and
interleaving the data content based on the interleaving rule after the data content is generated and before the second branch metrics are generated.

13. The decoding method of claim 11, wherein the first branch metrics comprise a first group and a second group, and the second branch metrics comprise a third group and a fourth group, the step of adjusting at least one of the first branch metrics according to the data content and the bit correction information to generate the second branch metrics comprises:
selecting a first weight or a second weight according to a reference bit of the bit correction information;
generating a first control value according to the target bit;
multiplying the first control value by the first weight or the second weight to generate a first adjustment value;
adding the first adjustment value to each of the first branch metrics of the first group to generate the second branch metrics of the third group;
generating a second control value according to the target bit;
multiplying the second control value by the first weight or the second weight to generate a second adjustment value; and
adding the second adjustment value to each of the first branch metrics of the second group to generate the second branch metrics of the fourth group.

14. The decoding method of claim 13, wherein the first control value and the target bit have opposite bit values, and the second control value and the target bit have a same bit value.

15. The decoding method of claim 14, wherein the first group and the third group correspond to the target bit being bit zero, and the second group and the fourth group correspond to the target bit being bit one.

16. The decoding method of claim 13, wherein the first adjustment value is one of the first weight and the second weight or zero, and the second adjustment value is one of the first weight and the second weight or zero.

17. The decoding method of claim 13, wherein the reference bit indicates whether the target bit has been corrected.

18. The decoding method of claim 17, wherein a length of the bit correction information is same as a length of the data content, and a position of the reference bit in the bit correction information is same as a position of the target bit in the data content.

19. The decoding method of claim 11, further comprising:
adding the first branch metrics or the second branch metrics to a plurality of previously accumulated metrics, respectively, to generate a plurality of accumulated metrics; and
selecting a survivor path according to the accumulated metrics and backtracking the survivor path to obtain a codeword corresponding to the survivor path.

20. The decoding method of claim 19, wherein the data content is a first data content, and the decoding method further comprises:
performing error correction on the codeword to obtain a second data content of the encoded data.

* * * * *